(12) United States Patent
Goeckner et al.

(10) Patent No.: US 6,182,604 B1
(45) Date of Patent: Feb. 6, 2001

(54) HOLLOW CATHODE FOR PLASMA DOPING SYSTEM

(75) Inventors: Matthew J. Goeckner, Plano, TX (US); Ziwei Fang, Sunnyvale, CA (US)

(73) Assignee: Varian Semiconductor Equipment Associates, Inc., Gloucester, MA (US)

(*) Notice: Under 35 U.S.C. 154(b), the term of this patent shall be extended for 0 days.

(21) Appl. No.: 09/427,869

(22) Filed: Oct. 27, 1999

(51) Int. Cl.[7] .................. C23C 16/00; C23C 14/00; H01J 7/24
(52) U.S. Cl. ................ 118/723 E; 118/723 R; 315/111.81; 204/298.02; 204/298.05
(58) Field of Search .............. 118/723 E, 723 FI, 118/723 CB, 723 FE, 723 ME, 723 R; 315/111.81, 111.21; 427/523, 355, 569; 204/298.05, 298.02, 298.04, 298.03, 298.01

(56) References Cited

U.S. PATENT DOCUMENTS

| | | |
|---|---|---|
| 4,135,097 | 1/1979 | Forneris et al. . |
| 4,595,837 | 6/1986 | Wu et al. . |
| 4,764,394 | 8/1988 | Conrad . |
| 4,786,814 | 11/1988 | Kolondra et al. . |
| 5,345,145 * | 9/1994 | Harafuji et al. ............... 315/111.81 |
| 5,354,381 | 10/1994 | Sheng . |
| 5,572,038 | 11/1996 | Sheng et al. ..................... 250/492 |
| 5,654,043 | 8/1997 | Shao et al. . |
| 5,711,812 | 1/1998 | Chapek et al. ................... 118/723 E |
| 5,911,832 | 6/1999 | Denholm et al. . |
| 5,970,907 * | 10/1999 | Takai et al. ..................... 118/723 E |
| 6,050,218 | 4/2000 | Chen et al. ...................... 118/723 E |

FOREIGN PATENT DOCUMENTS

0994203 A2   4/2000   (EP) .

OTHER PUBLICATIONS

Peter Kellerman, "PIII Dosimetry," Eaton, Implant Systems Division, Apr. 1999, pp. 1–13.

* cited by examiner

Primary Examiner—Gregory Mills
Assistant Examiner—Parviz Hassanzadeh
(74) Attorney, Agent, or Firm—Wolf, Greenfield & Sacks, P.C.

(57) ABSTRACT

A plasma doping apparatus includes a hollow cathode to increase throughput and uniformity of ion implantations in a target. The hollow cathode is located adjacent an anode and a target cathode on which a target is placed. An ionizable gas is provided in a space between the anode and the target cathode. The space in which the ionizable gas is provided is surrounded by the hollow cathode. The hollow cathode has either a circular or rectangular cross-section.

12 Claims, 5 Drawing Sheets

HOLLOW CATHODE FOR PLASMA DOPING SYSTEM

FIELD OF THE INVENTION

This invention relates to plasma doping systems used for ion implantation of workpieces and, more particularly, to a cathode geometry for plasma doping systems.

BACKGROUND OF THE INVENTION

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Exacting requirements are placed on semiconductor fabrication processes involving ion implantation with respect to the cumulative ion dose implanted into the wafer, implant depth, dose uniformity across the wafer surface, surface damage and undesirable contamination. The implanted dose and depth determine the electrical activity of the implanted region, while dose uniformity is required to ensure that all devices on the semiconductor wafer have operating characteristics within specified limits. Excessive surface damage, particularly chemical etch, or contamination of the surface can destroy previously fabricated structures on the wafer.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, it has been proposed to use Plasma Doping (PLAD) systems for forming shallow junctions in semiconductor wafers.

In a PLAD system, a semiconductor wafer is placed on a conductive platen located in a chamber, and the platen functions as a cathode. An ionizable gas containing the desired dopant material is introduced into the chamber, and a high voltage pulse is applied between the platen and an anode (or the chamber walls), causing the formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the PLAD system described above, the high voltage pulse generates the plasma and accelerates positive ions from the plasma toward the wafer. In other types of plasma implantation systems, known as Plasma-Source Ion Implantation, PSII, systems, a separate plasma source is used to provide a continuous plasma. (These implantation systems are also known by several other acronyms, the most common being Plasma-immersion Ion implantation, PIII.) In such systems, the platen and the wafer are immersed in this continuous plasma and at intervals, a high voltage pulse is applied between the platen and the anode, causing positive ions in the plasma to be accelerated toward the wafer. An example of such a system is described in U.S. Pat. No. 4,764,394, issued Aug. 16, 1988 to Conrad.

An advantage of a PLAD system over a PSII system is that the plasma is on only when the target object is being implanted. This results in a reduction of chemically active species that are produced by the continuous plasma of the PSII system and hence a reduction in chemical damage to the wafer surface. In addition, the continuous plasma can also cause high levels of implanted contaminants and high levels of particulate formation. The PLAD system improves on the PSII system by turning the plasma off except when the target object is biased to implant ions. This reduces the level of contaminants, particulates and surface etching damage.

PLAD systems have a minimum breakdown voltage $V_{bd}$ at which the plasma ignites and ions can be implanted. This breakdown voltage $V_{bd}$ is defined by the physical characteristics of the system, including the cathode surface material, the type of gas present in the system, the pressure P of the gas in the system and the distance d from the cathode to the anode. For a given surface material and gas type, the breakdown voltage curve $V_{bd}$ is a function of P×d and is known as the Paschen curve. The process is well described in plasma physics texts. Typically, the minimum value for the breakdown voltage $V_{bd}$ is near Pd≈500 millitorr-cm. For $BF_3$, a common feed gas used for PLAD of Si, the minimum breakdown voltage $V_{bd}$≈530 V. Other dopant feed-gas/substrate combinations will have similar minimum breakdown voltages $V_{bd}$. The implant energy of the ions in the plasma is directly proportional to the cathode to anode voltage in prior art PLAD systems.

In PLAD systems, the ion current to the cathode is a function of the applied voltage, gas pressure and surface conditions. For voltages near $V_{bd}$, the current is low. As the voltage or the pressure is increased, the current increases. In order to increase current and thereby reduce implant times, it is desirable to operate at higher pressures and voltages above $V_{bd}$. Local surface conditions, surface temperature, material, material structure (crystal vs. amorphous), etc., also play a role in the local ion current.

In order to increase production rates, i.e., increase the throughput of target wafers through the doping process, the time it takes to process each wafer needs to be decreased. As is known, the cycle time for a target wafer includes the time needed to evacuate the chamber, the time needed to introduce the dopant feed-gas and bring the chamber to the desired pressure, as well as the duration of time needed to bombard the target wafer with ion current to accomplish the desired level of dopant density. Thus, a way to improve production rates and uniformity using a PLAD system is needed.

SUMMARY OF THE INVENTION

According to a first aspect of the invention, a pulsed plasma processing system is provided. The system comprises an anode; a target cathode on which a first target is to be placed, the target cathode spaced apart from the anode and positioned substantially parallel thereto; and a hollow cathode disposed adjacent to each of the anode and the target cathode. The hollow cathode surrounds a portion of a space between the anode and the target cathode.

The system further comprises a first high voltage pulse source having an output, wherein the anode is coupled to a reference voltage; and the target cathode and the hollow cathode are each connected to the output of the first high voltage pulse source.

In another aspect of the invention, the system includes a first high voltage pulse source having a first output and a second high voltage pulse source having a second output. The anode is coupled to a reference voltage; the target cathode is coupled to the second output; and the hollow cathode is coupled to the first output.

In another aspect of the invention, a pulsed plasma processing system is provided. The system comprises an enclosure; an anode provided within the enclosure, the anode and enclosure coupled to a reference voltage; a target cathode on which a first target is to be placed, the target cathode provided within the enclosure, spaced apart from the anode and positioned substantially parallel thereto; a hollow cathode disposed within the enclosure and adjacent to each of the anode and the target cathode, the hollow cathode to surround a portion of a space between the anode and the target cathode; and a high voltage pulse source connected to the target cathode and the hollow cathode.

In yet another aspect of the present invention, a method of implanting ions in a first target in a pulsed plasma processing system is provided. The method comprises providing an anode; positioning a cathode spaced apart from and substantially parallel to the anode; providing the first target on the cathode; positioning a hollow cathode adjacent to, and between, the anode and the cathode; and applying a first high voltage pulse to the hollow cathode, wherein the hollow cathode surrounds a portion of a space between the anode and the cathode.

In still another aspect of the present invention, a pulsed plasma processing system, is provided including a first anode; a second anode spaced apart from and opposite to the first anode; a hollow cathode disposed adjacent to the first and second anodes, the hollow cathode to surround a space between the first and second anodes; and a first high voltage pulse source to supply a positive voltage pulse, relative to a reference voltage, to each of the first and second anodes; wherein the hollow cathode is coupled to the reference voltage.

BRIEF DESCRIPTION OF THE DRAWINGS

For a better understanding of the present invention, reference is made to the accompanying drawings, in which like reference numbers designate the same element and in which.

DETAILED DESCRIPTION

Figure 1:
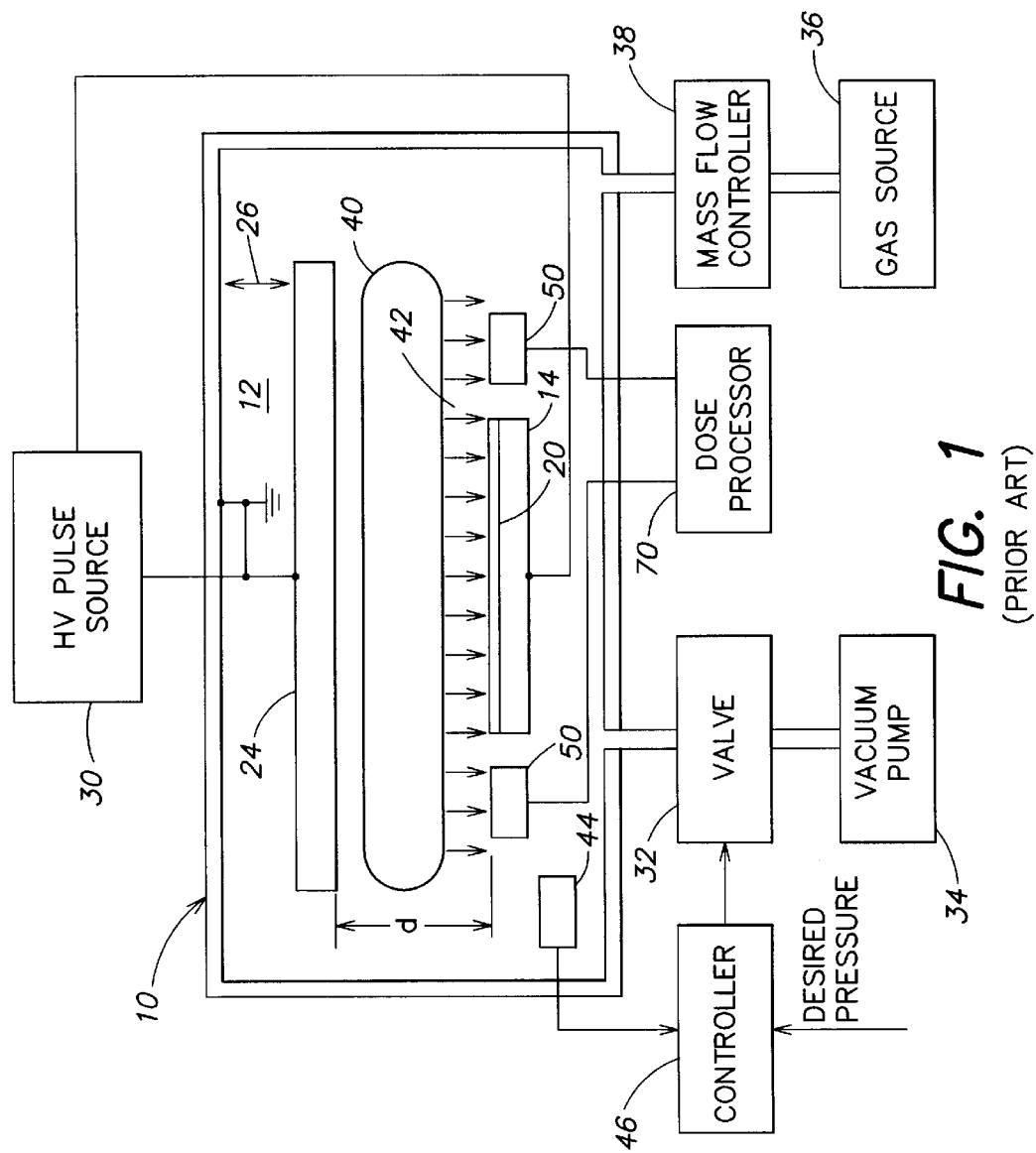
FIG. 1 is a schematic block diagram of a conventional plasma doping system.

An example of a conventional plasma doping system is shown schematically in FIG. 1. A plasma doping chamber 10 defines an enclosed volume 12. A platen (cathode) 14 positioned within chamber 10 provides a surface for holding a workpiece, such as a semiconductor wafer 20. Semiconductor wafers are only one example of possible target types. The invention is not limited to ion implantation in only semiconductor wafers. For example, ion implantation in metals for tools, automotive components, stamping dies and plastics is also possible. The wafer 20 may, for example, be clamped at its periphery to a flat surface of the platen 14. The platen 14 supports wafer 20 and provides an electrical connection to wafer 20. In one version, the platen 14 is substantially planar and has an electrically-conductive surface for supporting wafer 20. In another version, the platen 14 includes conductive pins for electrical connection to wafer 20.

An anode 24 is positioned within chamber 10 in spaced relation to the platen (cathode) 14. Anode 24 may be movable in a direction, indicated by arrow 26, perpendicular to platen 14. The anode 24 is typically connected to electrically-conductive walls of chamber 10, both of which may be connected to ground. In one version, the anode 24 and platen 14 are substantially parallel to one another.

The wafer 20 and the cathode 14 are connected to a high voltage pulse source 30, so that wafer 20 functions as a cathode. The pulse source 30 typically provides pulses in a range of about 100 to 10,000 volts, about 1 to 50 microseconds in duration and at a pulse repetition rate of about 100 Hz to 2 KHz. It will be understood that these pulse parameter values are given by way of example only and that other values may be utilized.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr to about 500 millitorr, but is not limited to this range. Gas source 36 supplies an ionizable gas containing a desired dopant for implantation into the workpiece. Examples of ionizable gases include $BF_3$, $N_2$, Ar, $PF_5$ and $B_2H_6$. Mass flow controller 38 regulates the rate at which gas is supplied to the chamber 10. The configuration shown in FIG. 1 provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 produce the desired pressure and gas flow rate within chamber 10. By way of example, the chamber 10 may operate with $BF_3$ gas at a pressure of ten millitorr. The pulse source 30 applies a series of high voltage pulses to the platen 14 and, thus to wafer 20, causing formation of a plasma 40 between wafer 20 and anode 24. As is known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14 and the wafer 20. The accelerated ions are implanted into wafer 20 to form regions of impurity material. The pulse voltage is selected to implant the positive ions to a desired depth in wafer 20. The number of pulses and the pulse duration are selected to provide a desired dose of impurity material (the positive ions) in wafer 20. The current per pulse is a function of pulse voltage, gas pressure, gas species, and any variable position of the electrodes. For example, the cathode to anode spacing may be adjusted for different voltages. A dose processor 70 is connected to current measuring devices 50 so as to measure the dose of positive ions being accumulated in the target wafer 20. In one system, the measuring devices 50 are Faraday cups. As is known, positive ions entering the Faraday cup produces a current in the circuit attached to the cup. The electrical current is indicative of the number of positive ions received per unit time, or ion current.

In the plasma doping system shown in FIG. 1, the platen 14 and the anode 24 are planar structures, i.e., essentially flat. The anode 24 and cathode 14 are each substantially planar structures that can be of any shape, e.g., rectangular, square, circular, etc., depending upon the particular application. The anode 24 and cathode 14 are spaced apart from one another by a distance d and are arranged so as to be substantially parallel to one another. As indicated above, the anode 24 is movable in the direction 26 to adjust distance d. As is known, the distance d, the pressure in the chamber, the type of ionizable gas and the value and timing of the high voltage pulse are all chosen depending upon the desired depth and dose of ion implantations.

Figure 2B:
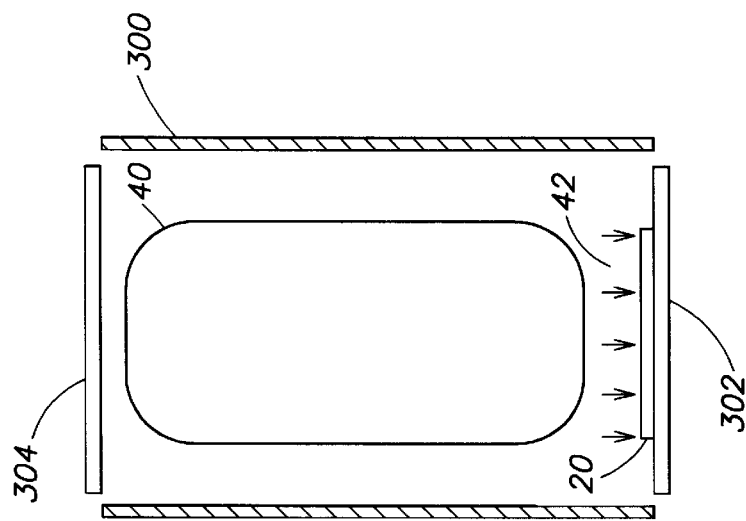
FIG. 2B is a cross-section of FIG. 2A taken along line 2B—2B in FIG. 2A.
Figure 2A:
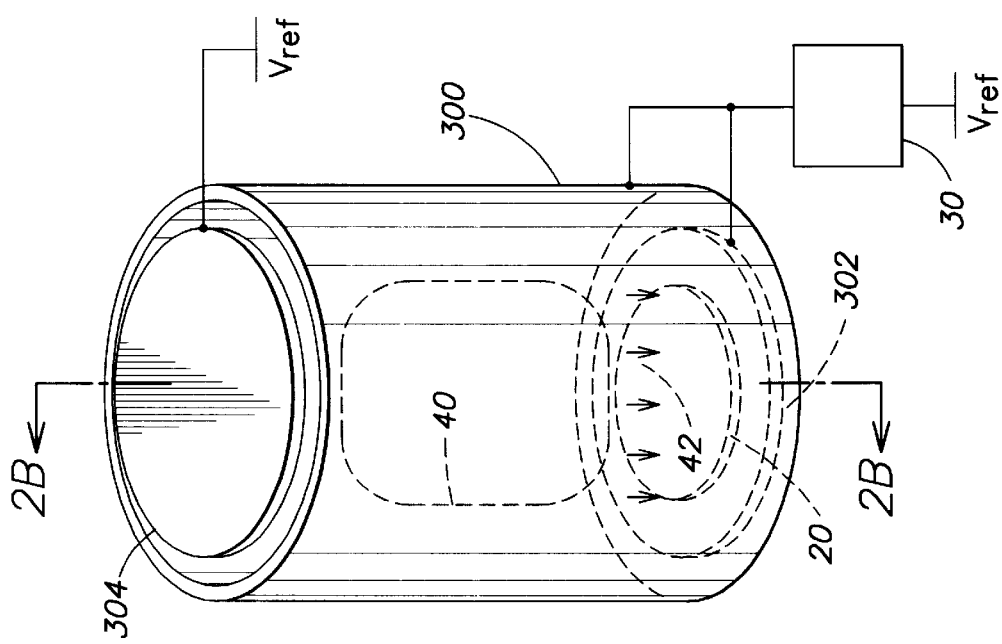
FIG. 2A is a schematic diagram of a first embodiment of the present invention.

In a first embodiment of the present invention, for implementation within a PLAD system such as FIG. 1, a planar anode 304 is disposed opposite a planar cathode 302 as shown in FIGS. 2A and 2B. The planar anode 304 and planar cathode 302 are arranged substantially parallel to one another. A hollow cylindrical cathode 300 is positioned to effectively surround a space between the planar anode 304 and the planar cathode 302. The hollow cylindrical cathode 300 is "hollow" in the sense that the geometric shape of the cathode 300 encloses or surrounds a space within. The cathode itself is not hollow as it is made of material known to be used to manufacture cathodes for PLAD systems, such as solid aluminum or silicon-coated solid aluminum.

The planar anode 304, in operation, is typically connected to a reference voltage $V_{ref}$, for example, ground, while both the cylindrical hollow cathode 300 and the planar cathode 302 are coupled to the output of a high voltage pulse source 30. A plasma 40 is formed between the planar anode 304 and the planar cathode 302 within the volume defined by the cylindrical hollow cathode 300. During the high voltage pulse, positive ions from plasma 40 are accelerated across plasma sheath 42 toward the target 20.

A cross-section of the first embodiment of the inventions, along line 2B—2B as shown in FIG. 2A, is presented in FIG. 2B. The cylindrical hollow cathode 300 can be physically separate from the planar cathode 302 or mechanically connected thereto. As an example, when the planar cathode 302 is attached to the hollow cathode 300, one end of the cylinder is closed, forming a "cup". The planar cathode 302 can be electrically coupled to the hollow cathode 300 and yet not creating a closed cup.

In operation, the hollow cathode produces a more uniform plasma and allows the use of a lower gas pressure. Hollow cathode discharges have an advantage over conventional cold cathode discharges since, for a given bias, gas, gas pressure and surface material, the hollow cathode has been shown to produce up to 100 times or greater, the current density of a planar cathode structure. This "hollow" cathode effect causes electrons to bounce back and forth between portions of the hollow cathode 300 to increase ionization and ion current. Since the current is higher, the throughput is also higher. Alternatively, lower pressures can be utilized resulting in the same implant time. Operation at lower gas pressure also requires less time to vacuum pump and then refill the chamber, since less dopant gas has to be reintroduced after evacuation, thus leading to increased throughput rates with lower gas consumption.

Figures 3A, 3B:
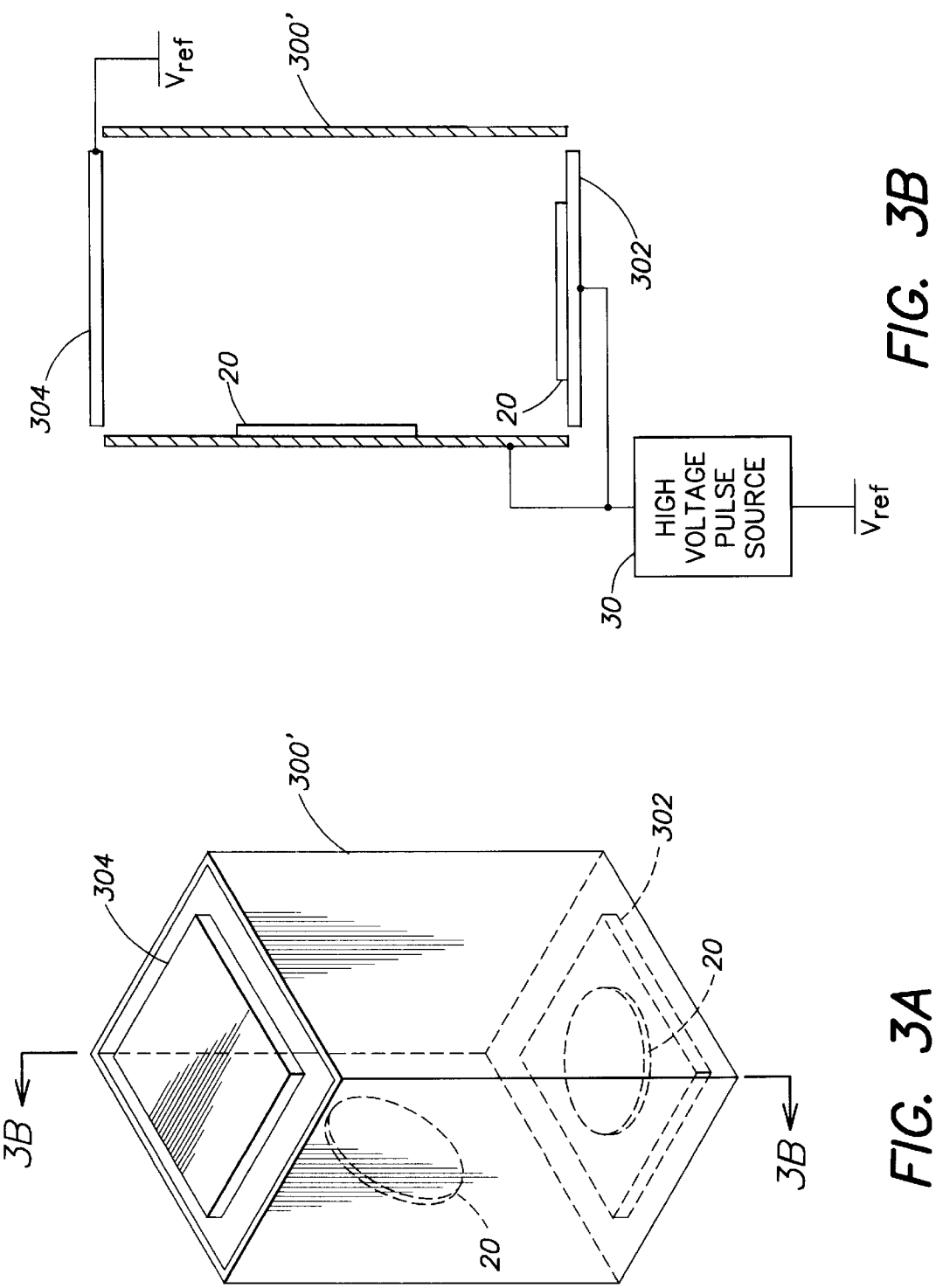
FIG. 3A is a schematic diagram of a second embodiment of the present invention.
FIG. 3B is a cross-section of FIG. 3A taken along line 3B—3B in FIG. 3A.

In a second embodiment of the present invention, as shown in FIG. 3A, the planar anode 304 and the planar cathode 302 are disposed substantially parallel to one another and spaced apart from one another, similar to the configuration shown in FIG. 2A. A rectangular hollow cathode 300' is disposed so as to enclose the volume between the planar anode 304 and the planar cathode 302. A cross-section of the second embodiment, along line 3B—3B as shown in FIG. 3A, is presented in FIG. 3B. For simplicity of illustration, the plasma 40 and plasma sheath 42 are not shown in FIGS. 3A and 3B.

The rectangular hollow cathode 300' of the second embodiment of the present invention allows the target wafer 20 to be placed either on the planar cathode 302 or on one of the walls of the rectangular hollow cathode 300'. Still further, a target wafer 20 may be positioned on the planar cathode 302, and one or more other target wafers 20 may be positioned on the wall or walls of the rectangular hollow cathode 300'. This ability to implant ions in more than one target wafer 20 at a time contributes to increased throughput for a plasma doping chamber using a rectangular hollow cathode 300' as shown in FIGS. 3A and 3B.

Of course, while the planar anode 304 and planar cathode 302, as shown in FIGS. 2A and 3A, are depicted as being circular or rectangular, one of ordinary skill in the art will understand that these planar structures may be circular or may have any other desired shape. Similarly, while a cylindrical hollow cathode 300 with a circular cross-section and a rectangular hollow cathode 300' with a rectangular cross-section have been described, a hollow cathode having, for example, a polygonal, multi-sided, or "D" cross-section may be used. Essentially, any geometry for the hollow cathode that causes the "hollow cathode effect" can be used.

The inventor has determined that the diameter of the hollow cathode affects the implantation uniformity. The smaller the diameter, the worse the uniformity. If the diameter of the hollow cathode is too large, however, its effectiveness is also reduced. The optimum diameter for a specific apparatus can be easily determined by one of ordinary skill in the art without undue experimentation. It is noted that a ratio of the diameter of the hollow cathode to the planar cathode in the range of 1.5–2 provides acceptable results. Additionally, it has been observed that the length of the hollow cathode also impacts uniformity and operation. If it is too short, the hollow cathode effect is not effective and uniformity is poor. If the hollow cathode is too long, efficiency is low because the plasma generated away from the implantation region is wasted. A ratio of the diameter to the length is in the range of 2–5 provides acceptable results.

Figure 4A:
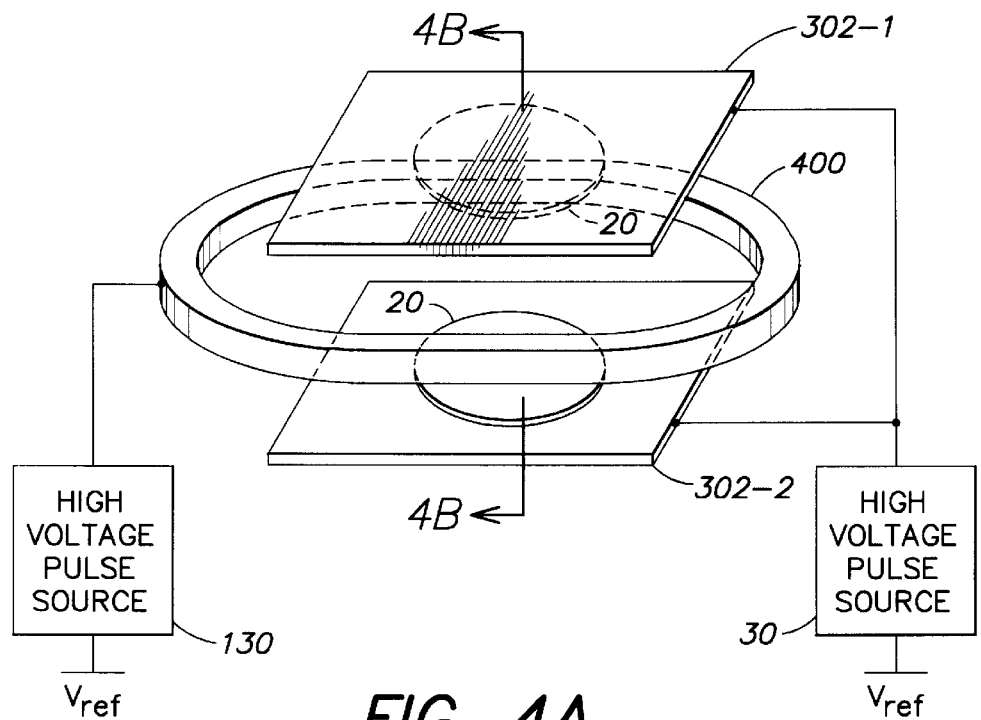
FIG. 4A is a schematic diagram of a third embodiment of the present invention.

In a third embodiment of the present invention, as shown in FIG. 4A, a ring anode 400 is disposed around the space between two planar cathodes 302-1, 302-2. In operation, cathodes 302-1, 302-2 are connected to the output of the high voltage pulse source 30, while the ring anode 400 is connected to a second high voltage pulse source 130. In a plasma doping system implementing the structure as shown in FIG. 4A, the ionizable gas is brought to the appropriate pressure and a plasma is created between the cathodes 302-1, 302-2. Advantageously, one or more target wafers 20 may be placed on the cathodes 302-1, 302-2 to implant ions into multiple targets simultaneously.

Figure 4B:
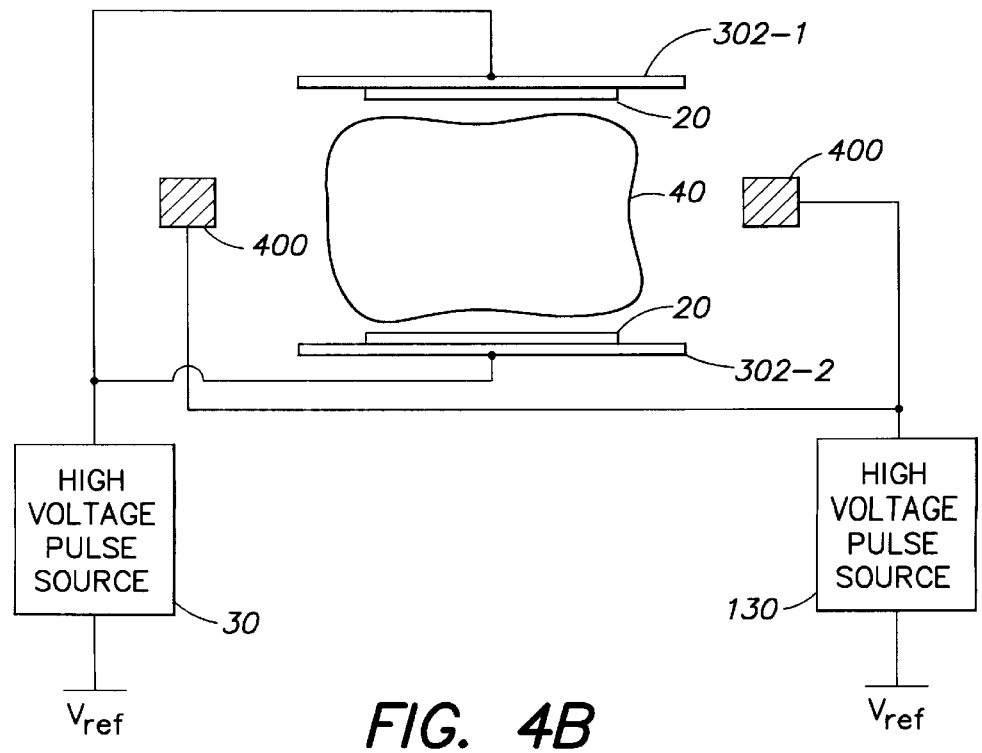
FIG. 4B is a cross-section of FIG. 4A taken along line 4B—4B in FIG. 4A.

A cross-sectional view along line 4B—4B of the embodiment as shown in FIG. 4A is represented in FIG. 4B. As shown in FIG. 4B, the plasma 40 is created between the cathodes 302-1, 302-2 to facilitate ion implantation into each of the target wafers 20.

Figure 5:
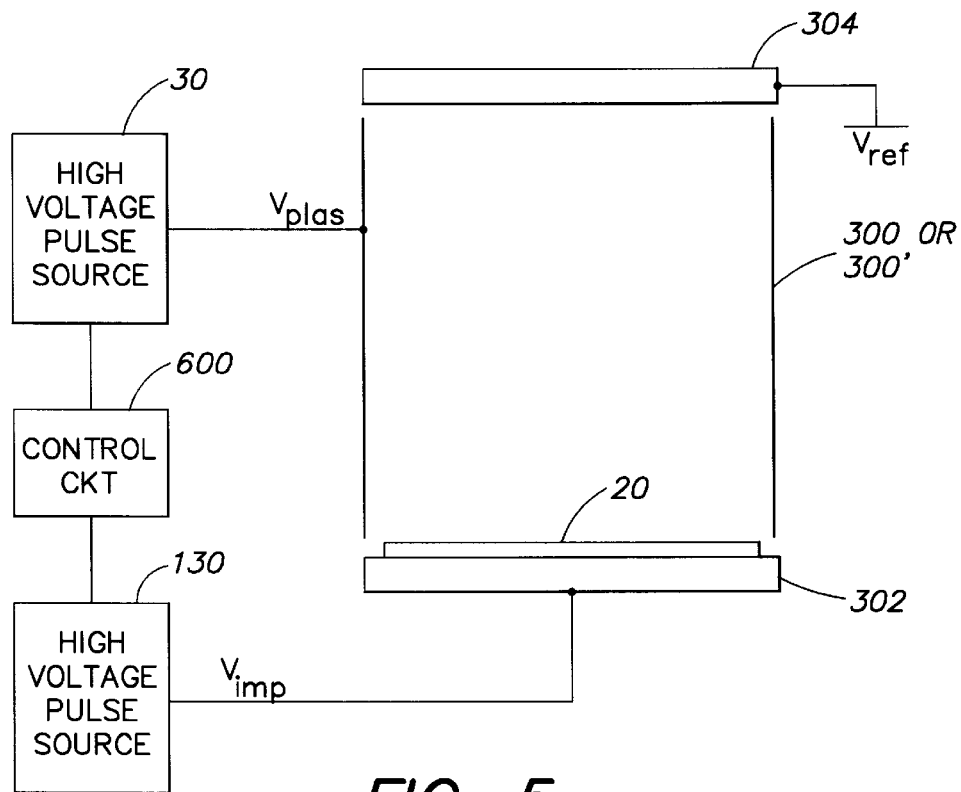
FIG. 5 is a cross-sectional schematic diagram of the present invention using dual PLAD pulses.

A variation of the embodiments of the present invention utilizing a hollow cathode is represented in cross-section in FIG. 5. The anode 304 is electrically coupled to $V_{ref}$, while the hollow cathode 300, 300' is electrically coupled to the output of the pulse generator 30. The planar cathode 302, however, is coupled to a second high voltage pulse source 130 to receive an implantation voltage pulse $V_{imp}$. This configuration provides for ion implantation below the Paschen curve as disclosed in the co-pending and commonly-owned application filed on even date herewith entitled METHOD AND APPARATUS FOR LOW VOLTAGE PLASMA DOPING USING DUAL PULSES Ser. No. 09/127,872, the contents of which are incorporated herein in their entirety.

Figure 6:
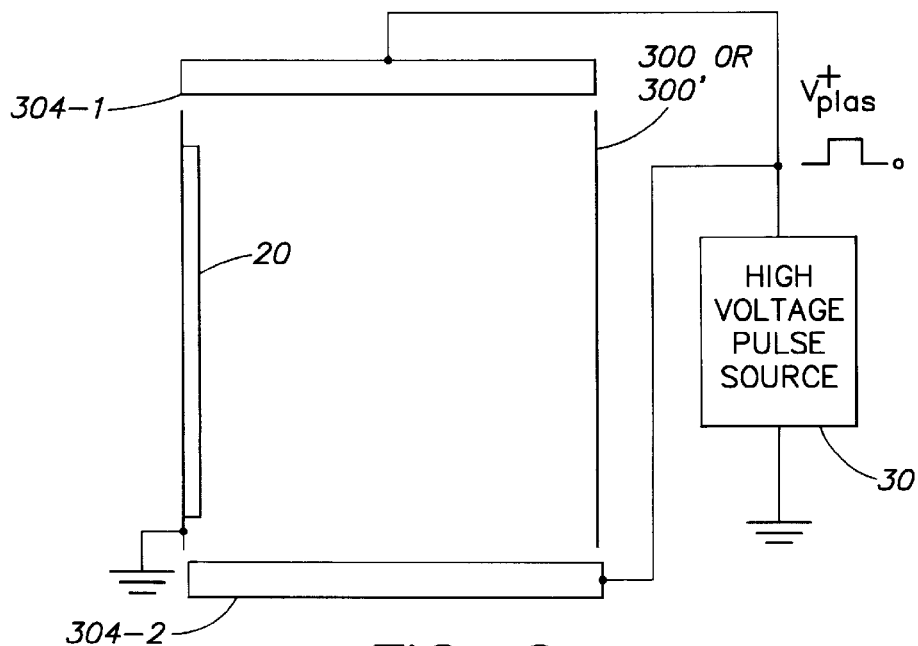
FIG. 6 is a cross-sectional schematic diagram of the present invention using a positive PLAD pulse.

Conventionally, PLAD systems are operated with a negative PLAD pulse provided to the target 20. As described above with reference to FIG. 1, the chamber 10 and the anode 24 are both connected to ground. As shown in FIG. 6, operation with a positive PLAD pulse is now possible. While operation with a positive PLAD pulse in the system described in FIG. 1 is possible, it is very difficult in reality to implement since the whole chamber has to be floated. According to the embodiment as shown in FIG. 6, the hollow cathode 300 or 300' and the chamber (not shown) are connected to ground. First and second planar anodes 304-1, 304-2 are positioned opposite one another with the hollow cathode disposed between them. A positive voltage pulse is applied to the planar anodes 304-1, 304-2. The same implantation process as previously described then occurs. Advantageously, in this embodiment, the current measurements can be done easily with the target wafer 20 at ground. There would be no displacement current present on the Faraday cups used to measure the current and sensitive current measurement schemes can be used.

The present invention makes use of a hollow cathode structure in order to improve uniformity of implantations in a PLAD system. The hollow cathodes may have several geometries and can be sized such that multiple wafers can be implanted at one time.

This increased current arises from trapping of fast secondary electrons (produced via ion bombardment of the cathode). Thus, for a given implant current (hence implant time) and bias voltage, the hollow cathode will allow use at lower gas pressures. Since the hollow cathode "traps" the fast electrons, a more uniform plasma is produced and thus a more uniform implant profile results.

An improvement in uniformity at low implant voltages (below 500 volts) has been measured when using the hollow cathode of the present invention. This improvement of uniformity was measured to be a factor of approximately five over a PLAD system without a hollow cathode. In addition, increases in implant rates of a factor of approximately two or greater have been observed.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A pulsed plasma processing system, comprising:
   an anode;
   a target cathode on which a first target is to be placed, the target cathode spaced apart from the anode; and
   a hollow cathode disposed adjacent to each of the anode and the target cathode,
   wherein the hollow cathode surrounds a portion of a space between the anode and the target cathode, and
   wherein the entire hollow cathode is at one potential.

2. The system as recited in claim 1, wherein the hollow cathode comprises one of a circular, a rectangular and a multi-sided cross-section.

3. The system as recited in claim 1, further comprising a first high voltage pulse source having an output, wherein:
   the anode is coupled to a reference voltage; and
   the target cathode and the hollow cathode are each connected to the output of the first high voltage pulse source.

4. The system as recited in claim 3, further comprising an ionizable gas within the space surrounded by the hollow cathode.

5. The system as recited in claim 1, further comprising a first high voltage pulse source having a first output and a second high voltage pulse source having a second output, wherein:
   the anode is coupled to a reference voltage;
   the target cathode is coupled to the second output; and
   the hollow cathode is coupled to the first output.

6. The system as recited in claim 1, further comprising a second target disposed on the hollow cathode.

7. A pulsed plasma processing system, comprising:
   an enclosure;
   an anode provided within the enclosure, the anode and enclosure coupled to a reference voltage;
   a target cathode on which a first target is to be placed, the target cathode provided within the enclosure, spaced apart from the anode;
   a hollow cathode disposed within the enclosure and adjacent to each of the anode and the target cathode, the hollow cathode to surround a portion of a space between the anode and the target cathode; and
   a high voltage pulse source connected to the target cathode and the hollow cathode,
   wherein the entire hollow cathode is at one potential.

8. The system as recited in claim 7, further comprising a second target disposed on the hollow cathode.

9. The system as recited in claim 7, wherein the hollow cathode comprises one of a circular, a rectangular and a multi-sided cross-section.

10. A pulsed plasma processing system, comprising:
    a first anode;
    a second anode spaced apart from and opposite to the first anode;
    a hollow cathode disposed adjacent to the first and second anodes, the hollow cathode to surround a space between the first and second anodes; and
    a first high voltage pulse source to supply a positive voltage pulse, relative to a reference voltage, to each of the first and second anodes;
    wherein the hollow cathode is coupled to the reference voltage.

11. The apparatus as recited in claim 10, wherein the reference voltage is ground.

12. The apparatus as recited in claim 11, wherein:
    a target wafer is positioned on the hollow cathode within the space between the first and second anodes.

* * * * *